United States Patent [19]

Taylor

[11] Patent Number: 5,652,875
[45] Date of Patent: Jul. 29, 1997

[54] IMPLEMENTATION OF A SELECTED INSTRUCTION SET CPU IN PROGRAMMABLE HARDWARE

[75] Inventor: Brad Taylor, Oakland, Calif.

[73] Assignee: Giga Operations Corporation, Berkeley, Calif.

[21] Appl. No.: 449,563

[22] Filed: May 24, 1995

Related U.S. Application Data

[63] Continuation of Ser. No. 127,859, Sep. 27, 1993, abandoned.

[51] Int. Cl.[6] .............................. G06F 9/00; G06F 15/177
[52] U.S. Cl. .................. 395/500; 364/229.4; 364/232.8; 364/240; 364/281.8; 364/262.8; 364/DIG. 1
[58] Field of Search .............................. 395/375, 800, 395/500

[56] References Cited

U.S. PATENT DOCUMENTS

| | | | |
|---|---|---|---|
| 4,037,094 | 7/1977 | Vandierendonck | 364/716 |
| 4,250,545 | 2/1981 | Blahut et al. | 395/375 |
| 4,422,141 | 12/1983 | Shoji | 395/375 |
| 5,042,004 | 8/1991 | Agrawa et al. | 395/275 |
| 5,175,824 | 12/1992 | Soderberg et al. | 395/325 |
| 5,208,490 | 5/1993 | Yetter | 307/452 |

*Primary Examiner*—Kevin J. Teska
*Assistant Examiner*—Ayni Mohamed
*Attorney, Agent, or Firm*—Adam H. Tachner; Crosby, Heafey, Roach & May

[57] ABSTRACT

A method of designing a CPU for implementation in a configurable hardware device by identifying a series of operations in a logic scheme which are suitable for implementation in the device, identifying an executable function and any needed parameters in the logic scheme, identifying the logic flow in the scheme, providing for at least two connected system resources to implement the logic scheme, selecting an op code, and providing a way to implement the various components needed to call and execute the function according to the logic scheme. A useful op code may invoke a system resource, implement the logic scheme, pass a parameter to the function, or invoke the function. The configurable hardware system can function as a CPU, using logic resources including a next address RAM, one or more registers, a function execution controller, and one or more busses for passing signals and data between the components and functions.

8 Claims, 1 Drawing Sheet

IMPLEMENTATION OF A SELECTED INSTRUCTION SET CPU IN PROGRAMMABLE HARDWARE

This is a continuation of application Ser. No. 08/127,859 filed on Sep. 27, 1993 now abandoned, entitled IMPLEMENTATION OF A SELECTED INSTRUCTION SET CPU IN PROGRAMMABLE HARDWARE.

FIELD OF THE INVENTION

This invention relates to a method of implementing a selected instruction set central processing unit in a programmable hardware device and a system with such a CPU.

BACKGROUND OF THE INVENTION

Most computational or process control tasks can be subdivided into a series of relatively simple steps or decisions. An engineer can analyze a task and design a logic scheme which can be implemented in a custom-designed circuit such as an ASIC or in a general purpose CPU such as an 8086 or Z-80. In a traditional implementation, a general purpose CPU can perform a wide variety of functions but must operate in a synchronous manner, processing only one step at a time. An ASIC can perform a variety of functions simultaneously and to a large extent asynchronously, but an ASIC can only implement the scheme for which it was designed. Thus an ASIC provides high speed but only for a specific functionality and a general purpose CPU provides great flexibility but at limited speed.

A central processing unit or "CPU", as used in this disclosure, is taken to mean a von Neumann machine. A minimum von Neumann machine can read input, write output which is dependent on the input, and includes both invert and add functions. These principle components and functions provide the basis for some very sophisticated devices but each is still a CPU.

A logic scheme can also be implemented in a programmable logic device (PLD) such as a field programmable gate array (FPGA). PLDs are available from several manufacturers, including Xilinx, AT&T, Altera, Atmel and others. In general, a PLD can operate much faster than a general purpose CPU and can handle asynchronous processes. A PLD is rarely as fast as an ASIC but does allow changes to the logic scheme.

The field of configurable hardware is well known and has been the subject of intense engineering development for the last few years. See in general the background section of co-pending, commonly-assigned U.S. patent application Ser. No. 07/972,933, filed Nov. 5, 1992, and now abandoned, entitled "SYSTEM FOR COMPILING ALGORITHMIC LANGUAGE SOURCE CODE INTO HARDWARE," which is incorporated in full herein by reference.

Previous implementations of PLDs, however, generally have been used only for a specific logic scheme which is changed only if the logic needs to be redesigned. Up until now, PLDs have been used to implement logical functions without using op codes since providing logical resources to interpret and execute op codes takes up precious resources.

A typical PLD application is as a monitor controller on a video board. As new monitors are released on the market or as the board designer develops an improved algorithm, the vendor may release revised configuration software for the PLD. This software can be distributed through traditional channels such as downloading from a bulletin board or asking the user to visit a distributor to have the new configuration loaded. Such revisions are relatively infrequent, possibly months or years apart.

An alternative way to implement logic functions is to load functions in hardware only as needed. This is particularly useful when certain functions are needed only rarely and only a limited amount of hardware resources are available. Thus the engineer would prefer to use the available resources for the most frequently used functions. Using techniques well known in cacheing schemes, the engineer can provide a variety of functions, each in a form ready to load as a configuration file, and load or unload functions as needed.

Until this time, engineers have only begun to consider the possibility of "cacheing" functions as hardware configurations. The present method provides a way to implement a wide variety of functions in programmable hardware devices.

SUMMARY OF THE INVENTION

This invention provides a method and system for designing and implementing a selected instruction set (SISC) CPU in programmable hardware. The method involves identifying a series of operations in a logic scheme which are suitable for implementation in the device, identifying an executable function and any needed parameters in the logic scheme, identifying the logic flow in the scheme, providing for at least two connected system resources to implement the logic scheme, selecting an op code, and providing a way to implement the various components needed to call and execute the function according to the logic scheme. A useful op code may invoke a system resource, implement the logic scheme, pass a parameter to the function, or invoke the function. The configurable hardware system can function as a CPU, using logic resources including a next address RAM, one or more registers, a function execution controller, and one or more busses for passing signals and data between the components and functions.

This CPU can initiate additional functions which may be quite complex. In general, the architecture can be used to implement a variety of related functions and provide a compact, fast and economical system.

One object of the invention is provide a method of analyzing a logic scheme and implementing it in configurable hardware as a CPU which processes op codes to initiate and coordinate any necessary functions.

Another object of the invention is to provide a specific instruction set CPU.

Yet another object of the invention is to provide a system to process multiple programs in the specific instruction set CPU.

DESCRIPTION OF THE PREFERRED EMBODIMENTS

Figure 1:
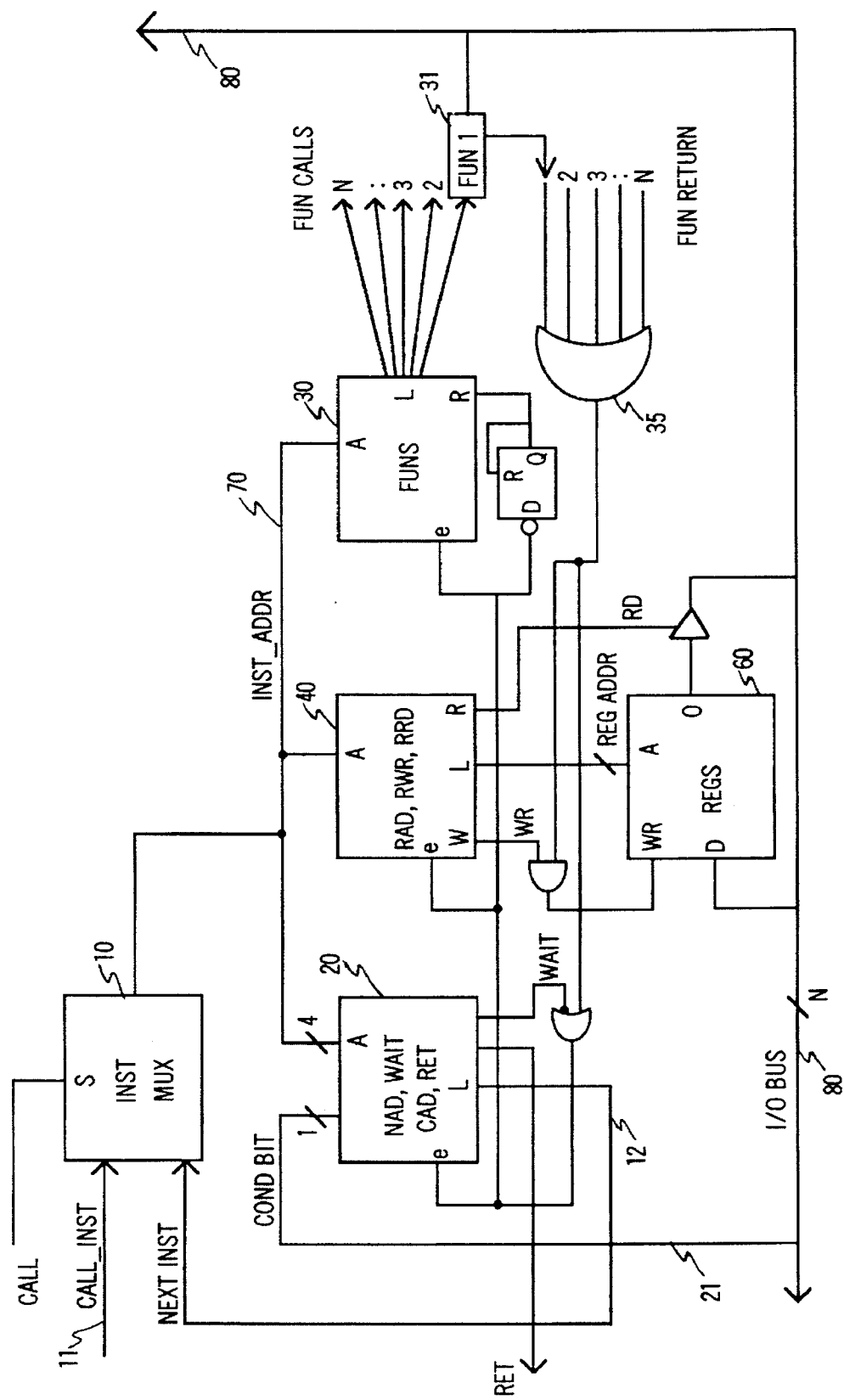
FIG. 1 illustrates a preferred configuration of a downloadable CPU.

Many computational or process control tasks fall into one of two classes—inherently sequential or inherently parallel. A sequential task, such as controlling a DRAM, follows a linear thread and executes only one step at a time.

An inherently parallel task, such as inverting an image or searching certain databases, may involve manipulating a number (often a very large number) of data elements in more or less the same way. Such a process can often be implemented as a sequential process but since the results of manipulating one set of data elements and manipulating another set of data elements are independent, the manipulations also can be done simultaneously. A parallel task is multithreaded and multiple threads can be launched simultaneously. A thread, in turn, may launch additional threads.

Referring to FIG. 1, a simple CPU can be implemented with instruction multiplexer 10, address RAM 20, function execution controller 30, and register address RAM 40, all connected by instruction address bus 70. Each component is discussed below in more detail.

In a preferred implementation each of 20, 30, 40, and 60 is a register, RAM or other memory portion. A programmable logic device such as a Xilinx 4003 can easily be configured to include one or more such memory components. Since the CPU is designed to implement a specific logic scheme, each portion can be scaled as needed. For example, the available (or needed) address space for one implementation may be fully addressable using only 2 bits, in which case instruction address bus 70 and the output of address RAM 10 can be two bits wide but a different implementation might require a larger address, in which case address RAM output and the bus must be correspondingly larger.

In a preferred implementation, address RAM 20 is used to hold the address of the next instruction to be executed. This provides a simple mechanism to execute a sequential program and allows for complex branching on conditions. The size of address RAM 20 can be selected to accommodate the largest address needed in a specific implementation. One means of handling branch on conditional is to provide a primary instruction store but wherever a branch can occur, providing an alternate instruction store so that a branch on condition can branch by simply evaluating the condition and selecting one instruction store if the condition is true and the other instruction store if the condition is false.

Function execution controller 30 can be configured with any number of bits, allocating one bit position for each of n functions to be executed under control of the CPU. The exact number of functions needed for any specific implementation will, in general, vary and the size of function execution controller 30 may take an integer value corresponding to the number of needed functions.

Separate circuits are provided for function 1 31, function 2 (not shown), and so on through function n (not shown). Each function may be partially or, preferably, completely implemented in configurable logic of a PLD. Each function may be independently connected to registers 60 or a constant store (not shown) as needed. Alternatively, some or all functions and appropriate resources can be connected together through a bus such as I/O bus 80. Thus each function can access any needed parameters, e.g. from registers, or global constants, e.g. from a constant store. When appropriate, a function can be connected to an external signal such as an external bus or an interrupt line. In a preferred implementation, for every function that must return a value or indicate completion, a "return" signal is connected to multi-input OR gate 35.

Register address RAM 40 is preferably a look-up table with pointers to actual registers 60. In general, any register can be accessed directly, thereby providing a store of local variables. By comparison, in the "C" software language, it is common to have a stack of local variables, which can be stored in registers or held in a stack. These registers provide a convenient means for passing parameters when invoking or returning from a function.

Instruction multiplexer 10 may be connected to external devices through lines 11, which may be a system bus, e.g. an ISA bus. Instruction multiplexer 10 as shown is also connected to address RAM 20 through line 12. This allows ready implementation of branch commands such as:

If (condition)

Then execute next instruction

Else skip to following instruction

If evaluation of a function (not shown) requires a skip, this condition can be signalled on condition line 21 and forwarded from address RAM 20 over line 12 to instruction multiplexer 10 which then discards the pending instruction and provides the next instruction in sequence.

Using this general structure a wide variety of functions can be implemented. One particular advantage of this type of structure is that the general CPU sequencer structure can be used with a great many functions. This is particularly useful, for example, for controlling nested "for" or "while" loops. The specific functions called by the loop may vary widely, but the present structure provides a mechanism for starting, controlling, and returning from such functions. Another particular advantage is that it is relatively easy to design new op codes in software but relatively time consuming to design and configure the illustrated CPU. Since many functions are invoked with a single bit over a single line, it is easy to provide a large number of functions in configurable hardware and connect or disconnect them to correspond to a current set of op codes. Using downloadable, reconfigurable hardware such as a Xilinx 4003, a new set of software op codes can be loaded in microseconds while it requires several milliseconds to completely reconfigure the CPU device.

Thus, if a large program would benefit from two or more CPUs of this general design but one implementation requires 14 op codes and calls 7 functions and another implementation requires only 3 op codes but calls 12 functions, it is easier to design one CPU that can handle 14 op codes (probably designed for 16) and between 12 and 19 function call lines (depending on the specific nature of the functions and any possible overlap) and then load only the op codes needed to operate the CPU during a corresponding phase of the operation of the part.

A fairly compact CPU can be designed using less than 16 instructions. If additional instructions are needed, a larger CPU can be implemented using the principles disclosed herein. Alternatively, an appropriate portion of the configuration can be stored and loaded as necessary.

The system, and method of designing such a system, can be better understood by considering the following.

The basic implementation of a CPU provides logical resources, suitably connected, to be able to execute a series of instructions. A designer must select what instructions can be executed by the CPU and provide for execution of each instruction. In a preferred implementation, instructions include an op code and instructions are stored in memory which may be but need not be part of the CPU. In general, the actual function is implemented by additional circuitry, which is not shown in the figure.

A very simple CPU may be implemented with even fewer components than the system shown in FIG. 1. The specific implementation is based on the specific functions that must be executed. A trivial function might be Register_1=x or, slightly more complicated, x=fn(x).

In general, an instruction set can be constructed with an arbitrary number of bit fields. A variety of op codes can be implemented, but preferably center on program control functions such as low level reads and writes, execution control, branch on conditional and such. Since multiple CPUs can be implemented and linked, each CPU can be optimized to execute a specific set of logic instructions and only the op codes needed to execute those instructions need be provided. In general, any computational functions are implemented separately and do not need an op code.

Listing 1 includes actual C language code that was implemented in the CPU illustrated in FIG. 1. Reference to that listing may assist the reader in understanding the present invention. The listing includes two separate code sections, 1) a simple input/output "ping" and 2) a bit blt file CPU. For each CPU, the listing includes variable declarations, public functions, CPU functions, code for each function called by the CPU ("low level functions") and code for the actual CPU ("host ()") plus extensive comments describing the opcode and bit fields and a table showing a control program to be executed.

In the "I/O Ping" implementation, op codes include:

NAD A bit field for the next instruction to execute (4 bits)

RET Return from function (1 bit)

WAIT Wait (suspend other execution) until called function returns (1 bit)

RAD Register address (preferably a look up table entry, e.g. 2 bits)

RRD Read register (load content of selected register on system I/O bus 80) (1 bit)

RWR Write register (load selected register from system I/O bus) 80 (1 bit)

In the preferred implementation, functions are launched by setting a bit in the op code corresponding to that function. In the I/O ping example, function_0 is "id_radd()" and function_5 is "dram_wr()". The comments under "OP CODE FIELDS" show the instruction words that will be compiled from the native C code. Compare the code for "host()". For example, the function "host write" begins with instruction 7 and completes with instruction 10. The "C" code for instruction 7 is ld_radd(hy)

and the corresponding instruction is:

| Inst | NAD | RET | WT | RAD | RRD | RWR | Fn0 | Fn1 | Fn2 | Fn3 | ... |
|---|---|---|---|---|---|---|---|---|---|---|---|
| 7 | 8 | 0 | 0 | 2 | 1 | 0 | 1 | 0 | 0 | 0 | ... | which corresponds to select register 2 (entry in LUT in 40)
read the contents of the register and load onto I/O bus 80
execute function 0 (which in turn is defined under low level functions)
and then execute instruction 8.

Instruction 8, which follows, launches two simultaneous functions: ld_dram_row() {Fun 1} and another call to ld_radd(hx) {function 0, but now selecting register 1}. If appropriate, each function could be launched simultaneously.

The bit blt CPU uses the same basic structure, but includes more functions and more complex instructions. The listing for the bit blt tile CPU adds an opcode CAD Conditional instruction (4 bits)
and implements 14 functions for execution on demand.

When a traditional C program is compiled for operation on a conventional CPU such as a 486 or a 68040, the compiler generates code that places function calls on a stack in memory. To pass parameters to a function, the parameters are loaded on a stack where they can be popped by the function. The calling function then waits for a "return" from the called function before resuming operation.

The present invention allows a similar scheme to be implemented in hardware. However, the hardware implementation is more powerful than the traditional software implementation since the traditional software runs on hardware than can in general handle only one instruction per execution cycle (although some pipelining in faster CPUs provides some speed benefit). With the present hardware implementation, any number of functions can be launched on a single execution cycle. The only limitations are that the programmer (or compiler) must be careful to identify any data dependencies between function calls that would necessitate operation in a certain order or relative time frame.

Extensive parallelism can be achieved using the present implementation, but the programmer (or compiler) must also identify any competing calls to shared system resources and add or exert program flow control to reduce or eliminate inconsistent attempts to simultaneously access system resources. One system resource of particular interest is a system bus, such as the I/O bus 80 in FIG. 1. In general, only one device or function should write data to the bus at any point in time. However, it is possible and sometimes desirable for more than one device or function to read data from the bus at any particular time. This might be useful, for example, to load identical constants into multiple functions, especially for initializing. If implemented properly, there should be few, preferably no, attempts by different devices or functions to attempt to seize control of the bus simultaneously.

The method and system described above can be very useful in a more comprehensive hardware implementation of algorithmic language code. An original source code program in a language such as "C" can be compiled to identify functionalities appropriate for implementation in the system described above and then loaded as a configuration in a PLD. See, in general, the methods and systems described in co-pending, commonly-assigned U.S. patent application Ser. No. 07/972,933, filed Nov. 5, 1992, and now abandoned, entitled "SYSTEM FOR COMPILING ALGORITHMIC LANGUAGE SOURCE CODE INTO HARDWARE," which is incorporated in full herein by reference.

The present system is particularly useful when used in conjunction with an automatic compiler that analyzes a given input source code to first identify functions or portions of functions that can be usefully implemented using the present system. In particular, most "for" or "while" loops are likely candidates for implementation as a specific instruction set CPU. As described in detail above, the management of the loop is generally suitable for the new CPU while the actual functions executed in the loops can be implemented separately using a variety of known techniques. Other inherently sequential operations may also be suitable for implementation using the present system.

Such a compiler should identify a loop or series of sequential operations, then collect information about each function called within that code segment, and any parameters required by each function. If the number of functions is not large, preferably less than about 16, then the compiler should identify a suitable set of op codes for passing any needed parameters to each function and for interlocking functions, as needed. Each function plus the specific instruction set CPU can be compiled and implemented in an appropriate section of programmable hardware, together with any needed connections.

A general description of the system and method of using the present invention as well as a preferred embodiment of the present invention has been set forth above. One skilled in the art will recognize and be able to practice additional variations in the methods described and variations on the device described which fall within the teachings of this invention. The spirit and scope of the invention should be limited only as set forth in the claims which follow.

Listing 1

```
PGA
part= "4003PC84-6";
mod_id=0xf0;
bit ppbuf clk=13;
CLK=clk;
/****************** IO PINS **************************/
int      pio   mbus_data={15,16,17,18, 19,20,23,24, 25,26,27,28, 36,37,38,41};
int4           mbus_nfun;
int4     pio   mbus_fun={78,57,35,39};
bit      pio   fast mbus_ok=40;
bit      pin   mbus_select=71;
bit            mbus_nok;
bit      mbus_master;
bit      mbus_slave;
bit      dram_slave;
void     mbus_return();
bit         reg_sel;
int10       uctr radd;
int8        pio dout dram_data={77,70,69,68,67,66,65,62};
int10       pin fast dram_addr={79,80,81,82,83,84, 3, 4, 5, 6};
bit            ras ,cas ,wr ,rd ;
bit         pin  cas_;
bit         pin  ras_,wr_,rd_;
            loc ras_ = 9;
            loc cas_=14;
            loc wr_ = 8;
            loc rd_ = 7;
bit         nclk nras;
bit         pin test0=72;
bit         pin test1=51;
bit         pin test2=29;
int8 pio lbus_data={61,60,59,58, 56,50,49,48};
int4 pio lbus_fun ={47,46,45,44};
/************** PUBLIC FUNCTIONS *********************/
int     mfun grad4_rd_reg     (int a1          )=0xf;
void    mfun grad4_wr_reg     (int a0 ,d0      )=0xe;
void    mfun grad4_wr_addr    (int mod,alo,ahi)=0xb;
void    mfun grad4_wr_dram    (int data        )=0xa;
int     mfun grad4_rd_dram    (                )=0x9;
void    mfun grad4_refresh    (                )=0x4;
void    mfun grad4_slave      (int id          )=0x1;
void    mfun gpu_go_tile      (                )=0x7;
void    mfun gpu_wr_addr      (int wra0,wra1,wra2,wra3)=0x8;
/******************* CPUS ****************************/
void        cpu  host(int host_d);
void        cpu  tile();
/************** CPU FUNCTIONS*************************/
void main();
void        post host_add();
void        post host_ref();
void        post host_wr (int host_wr_d);
void        post host_rd ();
void        post go_tile ();
/************** LOW LEVEL FUNCTIONS CALLED BY CPUS ***********/
void        post ld_radd(int10 radd_d);
void        post ld_dram_row();
void        post ld_dram_col();
int8        xfun dram_rd ();
void        post dram_wr (int10  dram_wr_d);
int         xfun dram_end();
void post ref();
void        post ld_ctr (int10 ld_ctr_d);
int10       post xfun rd_ctr();
```

Listing 1

```
int10     xfun inc_reg(int10 inc_reg_d);
void      post inc_ctr();
bit       post ctr_pos();
int8      post lbus_rd ();
void      post lbus_wr (int8 lbus_wr_d);
/******************* REGISTERS ***********************/
int10     uctr nctr;
int4      lfun;
/*=============== HOST CPU ================*/
/*    OPCODE FIELDS
      NAD=next instruction
      RAD=register address
      RRD=register is read onto bus when instruction is called
      RWR =register written from bus when function returns
      WAIT=wait for called function to return
      RET =return to caller
      FUN0=call ld_radd();
      FUN1=call ld_dram_row();
      FUN2=call ld_dram_col();
      FUN3=call ld_dram_end();
      FUN4=call dram_rd();
      FUN5=call dram_wr();
```

|      |     |      |      |      |      |      | radd | row  | col  | end  | rd   | wr   |
|------|-----|------|------|------|------|------|------|------|------|------|------|------|
| INST | NAD | :RET | :WAIT| :RAD | :RRD | :RWR | :FUN0| :FUN1| :FUN2| :FUN3| :FUN4| :FUN5|
| 0    | 0   | 0    | 0    | 0    | 0    | 0    | 0    | 0    | 0    | 0    | 0    | 0    |
| 1    | 2   | 0    | 0    | 1    | 0    | 1    | 0    | 0    | 0    | 0    | 0    | 0    |
| 2    | 0   | 1    | 0    | 2    | 0    | 1    | 0    | 0    | 0    | 0    | 0    | 0    |
| 3    | 4   | 0    | 0    | 2    | 1    | 0    | 1    | 0    | 0    | 0    | 0    | 0    |
| 4    | 5   | 0    | 0    | 1    | 1    | 0    | 1    | 1    | 0    | 0    | 0    | 0    |
| 5    | 6   | 0    | 1    | 0    | 0    | 1    | 0    | 0    | 1    | 0    | 1    | 0    |
| 6    | 0   | 1    | 1    | 1    | 0    | 1    | 0    | 0    | 0    | 1    | 0    | 0    |
| 7    | 8   | 0    | 0    | 2    | 1    | 0    | 1    | 0    | 0    | 0    | 0    | 0    |
| 8    | 9   | 0    | 0    | 1    | 1    | 0    | 1    | 1    | 0    | 0    | 0    | 0    |
| 9    | 10  | 0    | 0    | 0    | 0    | 0    | 0    | 0    | 0    | 1    | 0    | 1    |
| 10   | 0   | 1    | 1    | 1    | 0    | 1    | 0    | 0    | 0    | 1    | 0    | 0    |

```
*/
/*=============== HOST CPU ================*/
host()
{
    int hd,hx,hy;                              /* allocate a register file of   3 regs */
    host_add:
      hx=host_d;                               /* inst 1  */
      :hy=host_d;       return;                /* inst 2  */
    host_rd:
                        ld_radd(hy);           /* inst 3  */
      :ld_dram_row();   ld_radd(hx);           /* inst 4  */
      :ld_dram_col();   hd=dram_rd();          /* inst 4  */
      :hx=dram_end();   return;                /* inst 6  */
    host_wr:
                        ld_radd(hy);           /* inst 7  */
      :ld_dram_row();   ld_radd(hx);           /* inst 8  */
      :ld_dram_col();   dram_wr(hd);           /* inst 9  */
      :hx=dram_end();   return;                /* inst 10 */
}
/*=============== BIT BLT TILE CPU ================*/
/*    OPCODE FIELDS
      NAD=next instruction
      CAD=conditional instruction
      RAD=register address
      RRD=register is read onto bus when instruction is called
      RWR =register written from bus when function returns
      WAIT=wait for called function to return
      RET =return to caller
      FUN0 =ld_ctr();
      FUN1 =rd_ctr();
      FUN2 =ctr_pos())
      FUN3 =ld_radd();
      FUN4 =ld_dram_row();
      FUN5 =dram_rd();
      FUN6 =inc_ctr();
      FUN7 =lbus_wr();
      FUN8 =ld_dram col();
      FUN9 =dram_wr();
      FUN10=lbus_rd();
      FUN11=dram_end()
      FUN12=inc_reg();
      FUN13=inc_reg();
         INST  NAD :CAD    :RET :WAIT  :RAD    :RRD    :RWR   :FUN0  :FUN1  :FUN2  :FUN3  :FUN4  :FUN5 . . . . .
```

Listing 1

| | | | | | | | | | | | | | |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 1 | 2 | 2 | 0 | 0 | iy | 1 | 0 | 0 | 0 | 0 | 0 | 0 | 0 |
| 2 | 3 | 3 | 0 | 0 | y | 0 | 1 | 0 | 0 | 0 | 0 | 0 | 0 |
| 3 | 4 | 4 | 0 | 0 | ny | 1 | 0 | 0 | 0 | 0 | 0 | 0 | 0 |
| 4 | 3 | 3 | 0 | 0 | cy | 0 | 1 | 0 | 0 | 0 | 0 | 0 | .0 |
| 3 | 15 | 6 | 0 | 0 | 0 | 0 | 0 | 0 | 0 | 0 | 0 | 0 | 0 |
| 6 | 7 | 7 | 0 | 0 | nx | 1 | 0 | 0 | 0 | 0 | 0 | 0 | 0 |
| 7 | 8 | 8 | 0 | 0 | y | 1 | 0 | 0 | 0 | 0 | 0 | 0 | 0 |
| 8 | 9 | 9 | 0 | 0 | ix | 1 | 0 | 0 | 0 | 0 | 0 | 0 | 0 |
| 9 | 12 | 10 | 0 | 0 | 0 | 0 | 0 | 0 | 0 | 0 | 0 | 0 | 0 |
| 10 | 11 | 11 | 0 | 1 | 0 | 0 | 0 | 0 | 0 | 0 | 0 | 0 | 0 |
| 11 | 9 | 9 | 0 | 0 | 0 | 0 | 0 | 0 | 0 | 0 | 0 | 0 | 0 |
| 12 | 13 | 13 | 0 | 1 | x | 1 | 0 | 0 | 0 | 0 | 0 | 0 | 0 |
| 13 | 14 | 14 | 0 | 1 | y | 1 | 1 | 0 | 0 | 0 | 0 | 0 | 0 |
| 14 | 5 | 5 | 0 | 1 | cy | 1 | 1 | 0 | 0 | 0 | 0 | 0 | 0 |
| 15 | 0 | 0 | 1 | 0 | 0 | 0 | 0 | 0 | 0 | 0 | 0 | 0 | 0 |

```
*/
tile()
{
 int10 x,y,ix,iy,nx,ny,cy,cx;
go_tile:
  ld_ctr(iy);
:y=rd_ctr();
:ld_ctr(ny);
:cy=rd_ctr();
:while(ctr_pos())
  {
  :ld_ctr(nx);
  :                          ld_radd(y);
  :ld_dram_row();            ld_radd(ix);
  :while(ctr_pos())
    {
      :dram_rd(); inc_ctr();  lbus_wr();    ld_dram_col();
      :dram_wr();             lbus_rd();
    }
  :x =dram_end();
  :y =inc_reg(y);
  :cy=inc_reg(cy);
  }
:return;
}
/*========= LOW LEVEL FUNCTIONS =========*/
inc_reg()
{
 nctr=inc_reg_d;
:nctr++;
:return(nctr);
}
ld_ctr()
{
 nctr=ld_ctr_d;
}
rd_ctr()
{
 return(nctr);
}
ctr_pos()
{
 return(nctr.9);
}
lbus_wr()
{
    lbus_data=dram_data; lbus_fun=lfun;
}
lbus_rd()
{
    return(dram_data);
}
gpu_go_tile()
{:
 go_tile();
}
main()
{
 dram_addr=radd;
 reg_sel==mbus_data>>4;
 test0==tile_regs_z;
 test1==tile_regs_wr;
```

Listing 1

```
  test2===nctr_inc;
  nras=ras;
}
ld_dram_row()
{
  ras=1; ras_===~nras;
}
ld_radd()
{
  radd=radd_d;
}
ld_dram_col()
{
  cas=1; cas_===~cas;
}
dram_end()
{
  cas=0; ras=0; rd=0; wr=0; radd++;
:
  return(radd);
}
dram_rd()
}
  rd_===~rd;
  rd=1; wr=0;
:;
:return(dram_data);
}
draw_wr()
{
  wr_===~wr;
  rd=0; wr=1; dram_data=dram_wr_d;
}
ref()
{
  :ld_dram_col();
  :ld_dram_row();
  :xio=()dram_end;
}
/******************** PUBLIC FUNCTIONS **********************/
grad4_slave()
{:
  mbus_slave=mbus_select;
}
grad4_wr_reg()
{:
  if(mbus_slave)
  {
    host_rad=a0; tile_rad=a0;
    if(~reg_sel)
    {:
      host_regs[host_rad]=xio; xio=d0;
    }
    if( reg_sel)
    {:
      tile_regs[tile_rad]=xio; xio=d0;
    }
}}
grad4_rd_reg()
{:
  if(mbus_slave)
  {
    host_rad=a1; tile_rad=a1;
    if(~reg_sel)
    {
    : return(host_regs);
    }
    if( reg_sel)
    {
    : return(tile_regs);
    }
}}
grad4_wr_addr()
{:
  mbus_slave=mbus_select;
  if(mbus_select)
  {
    host_add();
```

Listing 1

```
:
  xio=a1;
:
  xio=a1;
 }
}
grad4_wr_dram()
{:
 if(mbus_slave)
 {
   host_wr(); xio=data; host_regs_inp=xio;
 }
}
grad4_rd_dram()
{:
 if(mbus_slave)
 {
   return(host_regs);
   host_rd();
 }
}
grad4_refresh()
{:
  ref();
}
/*======== FIX LOCATION OF REGISTERS ========*/
loc host_rad ={ 0x12,0x12, 0x13,0x13 };
loc host_regs={ 0x22,0x22, 0x23,0x23, 0x24,0x24, 0x25,0x25, 0x26,0x26,
0x27,0x27, 0x28,0x28, 0x29,0x29 };
loc tile_rad ={ 0x32,0x32, 0x33,0x33 };
loc tile_regs={ 0x42,0x42, 0x43,0x43, 0x44,0x44, 0x45,0x45, 0x46,0x46};
/* loc radd      = 0x36; */
weight xio=99;
weight mbus_data=99;
;
;
DEND
```

What is claimed is:

1. A method of designing a CPU for implementation in a configurable hardware device, said method comprising:

providing a logic scheme, providing a configurable hardware device, identifying a plurality of operations in a logic scheme which are suitable for implementation in said configurable hardware device, identifying an executable function in said logic scheme, identifying a parameter, if any, required for said executable function, identifying the logic flow in said scheme and providing for at least two connected, configurable system resources, each of selected size, to implement said logic scheme, selecting an op code of configurable, selected size to control said executable function, and providing a way to implement in configurable hardware:
  each of said connected, configurable system resources,
  a means to provide any needed parameter to said executable function,
  a means to pass said op code to said system resources, and
  a means to call said executable function, where said op code is selected from the group consisting of
   an op code to invoke at least one of said system resources and implement said logic scheme,
   an op code to pass a parameter to said executable function, and
   an op code to invoke said executable function.

2. The method of claim 1 wherein said plurality of operations is inherently sequential.

3. The method of claim 1 wherein said plurality of operations is inherently parallel.

4. The method of claim 1 further comprising providing a bus line to pass said parameter.

5. The method of claim 4 further comprising identifying the logic flow in said scheme and providing for at least two connected system resources to implement said logic scheme.

6. The method of claim 1 further comprising executing said function.

7. The method of claim 1 wherein said plurality of operations includes a first and a second of said operations capable of executing simultaneously.

8. The method of claim 1 wherein said plurality of operations includes a plurality of said operations capable of executing simultaneously.

* * * * *